United States Patent
Huang (10) Patent No.: US 10,642,686 B2
(45) Date of Patent: May 5, 2020

(54) BIT-SCALE MEMORY CORRECTING METHOD

(71) Applicant: TARGPS TECHNOLOGY CORP., New Taipei (TW)

(72) Inventor: Chih-Jen Huang, New Taipei (TW)

(73) Assignee: TARGPS TECHNOLOY CORP., New Taipei (TW)

(*) Notice: Subject to any disclaimer, the term of this patent is extended or adjusted under 35 U.S.C. 154(b) by 0 days.

(21) Appl. No.: 15/869,328

(22) Filed: Jan. 12, 2018

(65) Prior Publication Data

US 2019/0220350 A1    Jul. 18, 2019

(51) Int. Cl.
    *G06F 11/10*    (2006.01)
    *G06F 11/00*    (2006.01)
    *G11C 29/52*    (2006.01)
    *G11C 29/04*    (2006.01)

(52) U.S. Cl.
    CPC .......... *G06F 11/1068* (2013.01); *G11C 29/52* (2013.01); *G11C 2029/0411* (2013.01)

(58) Field of Classification Search
    None
    See application file for complete search history.

(56) References Cited

U.S. PATENT DOCUMENTS

| | | | |
|---|---|---|---|
| 6,425,108 B1* | 7/2002 | Chiang | G06F 11/1008 714/723 |
| 2009/0161429 A1* | 6/2009 | Chen | G11C 29/82 365/185.09 |
| 2009/0217281 A1* | 8/2009 | Borkenhagen | G06F 11/1048 718/104 |
| 2014/0157088 A1* | 6/2014 | Chih | G06F 11/1004 714/773 |
| 2015/0058664 A1* | 2/2015 | Wu | G06F 11/25 714/6.32 |
| 2017/0090788 A1* | 3/2017 | Shlick | G06F 3/0619 |
| 2018/0129554 A1* | 5/2018 | Glancy | G06F 11/102 |
| 2019/0122746 A1* | 4/2019 | Berger | G11C 29/76 |

* cited by examiner

*Primary Examiner* — Justin R Knapp
(74) *Attorney, Agent, or Firm* — Rosenberg, Klein & Lee (57) ABSTRACT

A bit-scale memory correcting method comprises steps: providing a memory with a plurality of memory bytes each having M bits, wherein M is a positive integer; adding a correcting byte to each memory byte, wherein the correcting byte has N correcting bits, and wherein N is a positive integer and smaller than M; detecting whether there is any underperforming bit in all the memory bytes and correcting bytes; if no, terminating memory correction; if yes, using the non-underperforming bits of the correcting byte to replace the underperforming bits of the memory byte, wherein the quantity of the non-underperforming bits of the correcting byte is corresponding to the quantity of the underperforming bits of the memory byte. The present invention proposes a simple and fast memory bit correcting method to decrease the redundant bits for correcting memory bits.

7 Claims, 7 Drawing Sheets

BIT-SCALE MEMORY CORRECTING METHOD

BACKGROUND OF THE INVENTION

Field of the Invention

The present invention relates to a method for correcting underperforming memory elements, particularly to a bit-scale memory correcting method.

Underperforming memory elements as used in the following paragraphs are commonly referred to as defective bits which do not reliably meet specific computer parameter characteristics.

Description of the Prior Art

Nowadays, the demand for various types of chip-based memory devices is growing fast, including Random Access Memory (RAM), Read-Only Memory (ROM), Non-Volatile Memory (NVRAM), Dynamic Random Access Memory (DRAM), Embedded Flash memory, Embedded DRAM, etc. No matter what type a memory device is, quality, performance, and reliability is very important. The manufacturers have to undertake repeated and reliable detection and correction in chip-based memory devices to promote the quality, reliability and competitiveness of chip-based memory products.

The conventional memory correcting methods, such as the Error-Correcting Code (ECC) method and the Redundancy method, provide too many error-correcting bits or substituent bits. For example, the Hamming Code, which is one of the ECC method, needs n+1 bits to correct a single bit for each $2^n$ bits. Thus, each 128 ($2^7$) bits needs 7+1 bits for correction in the Hamming Code. In other words, totally 128+8 bits are used in one byte. Therefore, the conventional correcting method consumes too many extra correcting bits, which amount to 6.25% of the original bits. Another conventional correcting method, the Bose-Chaudhuri-Hocquenghem (BCH) Code, needs 2*n+1 bits for correcting 2 bits in $2^n$ bits. While the bits needing correction are increased, the bits used for correction will increase rapidly. Therefore, the two abovementioned correcting methods need a great number of correcting bits or substituent bits. In addition to the vast consumption of the correcting bits, the conventional correcting method also needs the addresses of the bits for comparison and the addresses of the fuse arrays for storing the defects. Thus, although the number of the correcting bytes is normally very few, the density of each correcting byte is very high. While only a single bit is damaged, it is normally the entire byte that is replaced. Therefore, the conventional correcting method also consumes too many bits.

In order to overcome the abovementioned problems, the present invention proposes a simple memory correcting method to reduce the number of the correcting bits extra provided for correction.

SUMMARY OF THE INVENTION

The primary objective of the present invention is to provide a bit-scale memory correcting method, which is a simple correcting method, wherein correcting bits are added to bytes while the bytes of the memory are formed. The correcting bits of the present invention are simpler than that of the conventional correcting method. Further, the quantity of the correcting bits of the present invention is lower than that of the conventional correcting method.

Another objective of the present invention is provide a bit-scale memory correcting method, wherein minimal correcting bits are added to the memory bytes in fabrication and prepared for correcting the underperforming bits. While underperforming bits are detected, the correcting bits are used to replace the underperforming bits to restore the performance of the bytes of the memory.

In order to achieve the abovementioned objectives, the present invention proposes a bit-scale memory correcting method, which comprises steps: providing a memory with a plurality of memory bytes each having M bits, wherein M is a positive integer; adding a correcting byte to each memory byte, wherein the correcting byte has N correcting bits, and wherein N is a positive integer and smaller than M; detecting whether there is any underperforming bit in all the memory bytes and correcting bytes; if no, terminating the correction of all the memory bytes; if yes, using the non-underperforming bits of the correcting bytes to take the place of the underperforming bits of the memory bytes, wherein the quantity of the non-underperforming bits of the correcting byte is corresponding to the number of the underperforming bits of the memory byte. The present invention can cooperate with a bit-line correcting method and a word-line correcting method to correct bit-line-scale errors, word-line-scale errors and bit-scale errors that cannot be burnt out or put to a non-0 and non-1 third state.

In one embodiment, the underperforming bits of the memory byte are burnt out or put to a non-0 and non-1 third state before the bits of the correcting byte are used to take the place of the underperforming bits of the memory byte; the underperforming bits of the correcting byte are labeled via burning them out or putting them to a non-0 and non-1 third state.

In one embodiment, the quantity of all the underperforming bits of a memory byte does not exceed N.

In one embodiment, the underperforming bits of memory bytes and correcting bytes are detected via the internal reading, writing or disturbing, or the external disturbing of temperature, magnetic fields or electric fields.

In one embodiment, after all the memory bytes have been corrected, the bits of each corrected memory byte are rearranged.

In one embodiment, the corrected memory bytes and the correcting bytes are used as data bits or used as the parity bits of the Error-Correction Code (ECC), whereby to enhance the reliability in application.

In one embodiment, the bit-line and word-line correcting methods are also used to correct the memory bytes and correcting bytes, which contain bit-line-scale errors, word-line-scale errors, and bit-scale errors that cannot be burnt out or put to a non-0 and non-1 third state, whereby to achieve a superior correction efficiency.

Below, embodiments are described in cooperation with the attached drawings to make easily understood the objectives, technical contents, characteristics and accomplishments of the present invention.

DETAILED DESCRIPTION OF THE INVENTION

The present invention uses the extra-added correcting bits to relieve the burden of the redundant correcting bits resulting from the conventional algorithm. In the present invention, it is unnecessary to replace all the bits of a byte having an underperforming bit. Therefore, the method of the present invention is simple, convenient, and able to reduce the cost of fabricating memory bytes.

Figure 1:
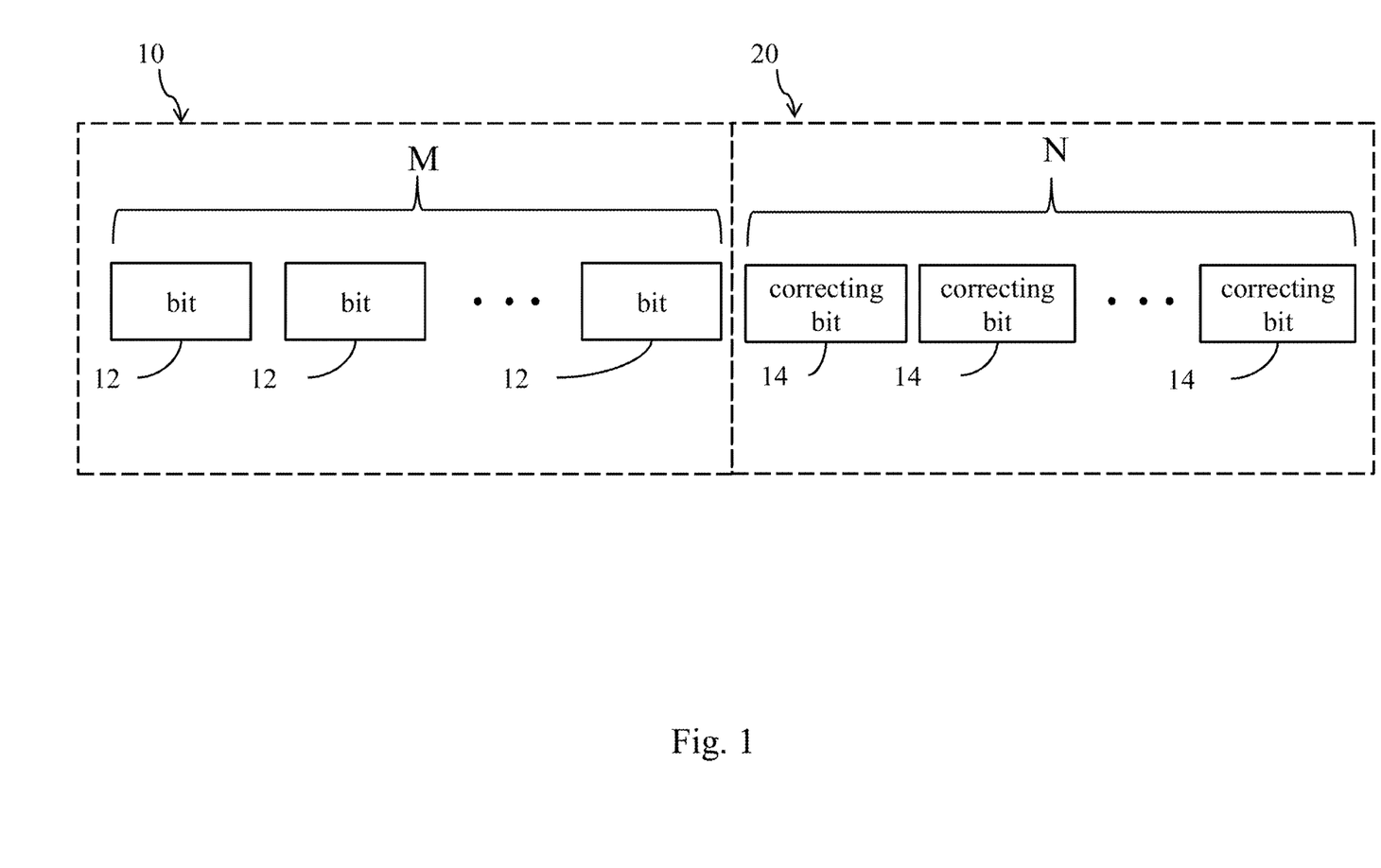
FIG. 1 is a diagram schematically showing the architecture of a bit-scale memory correcting method according to one embodiment of the present invention.

Refer to FIG. 1. A memory byte 10 contains M bits 12. A correcting byte 20 contains N correcting bits 14, wherein the N correcting bits 14 are prepared for correction. Each of M and N is a positive integer, and N is smaller than M. For example, M is 64, and N is 8. However, the present invention is not limited by the abovementioned numbers. These numbers are only for exemplification. In addition to functioning as data bits, the corrected memory bytes and the correcting bytes can also be used as the parity bits of the Error-Correction Code (ECC), whereby to increase the reliability in application.

Figure 2A:
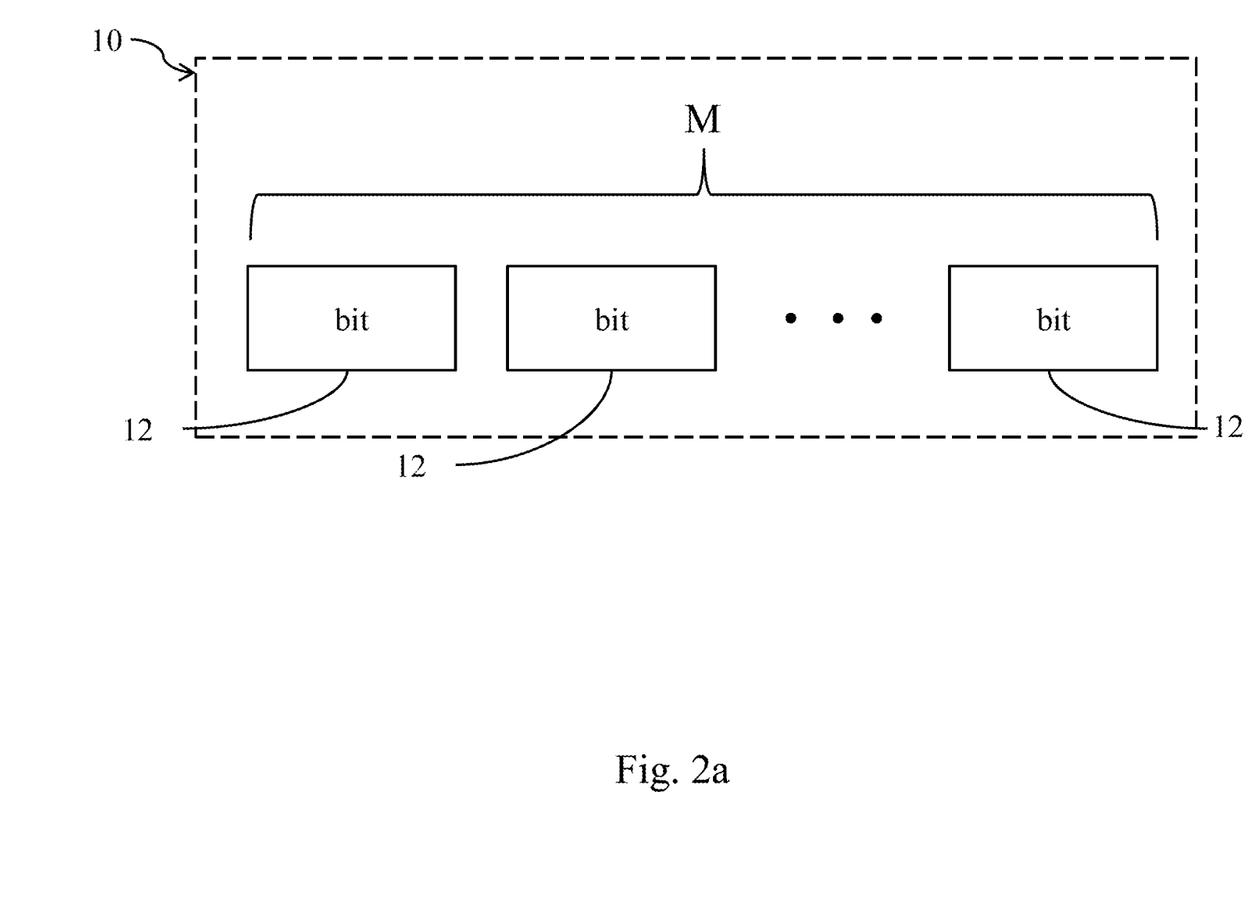
FIGS. 2a-2d are diagrams schematically showing the steps of a bit-scale memory correcting method according to one embodiment of the present invention.
Figure 2B:
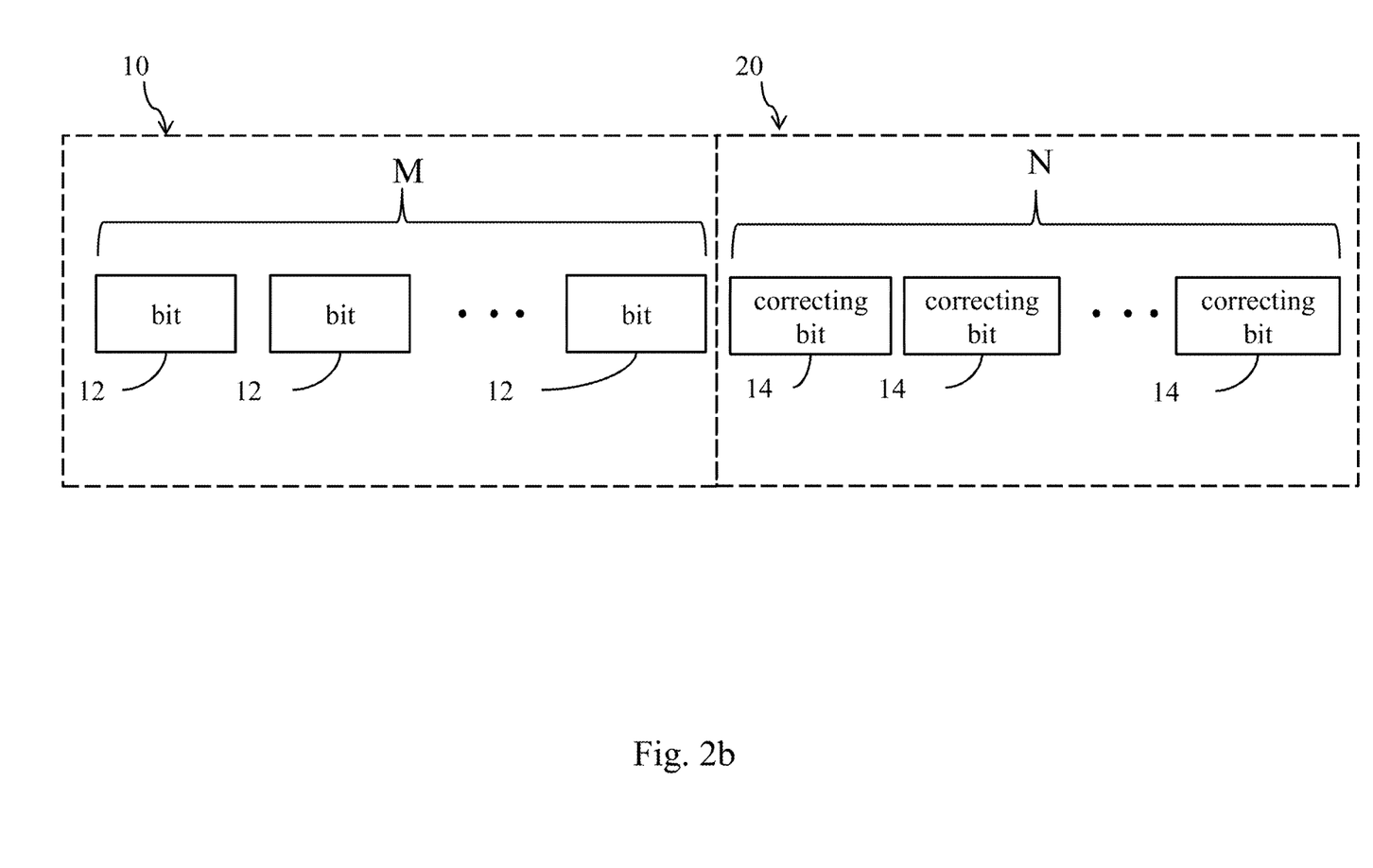
Figure 2C:
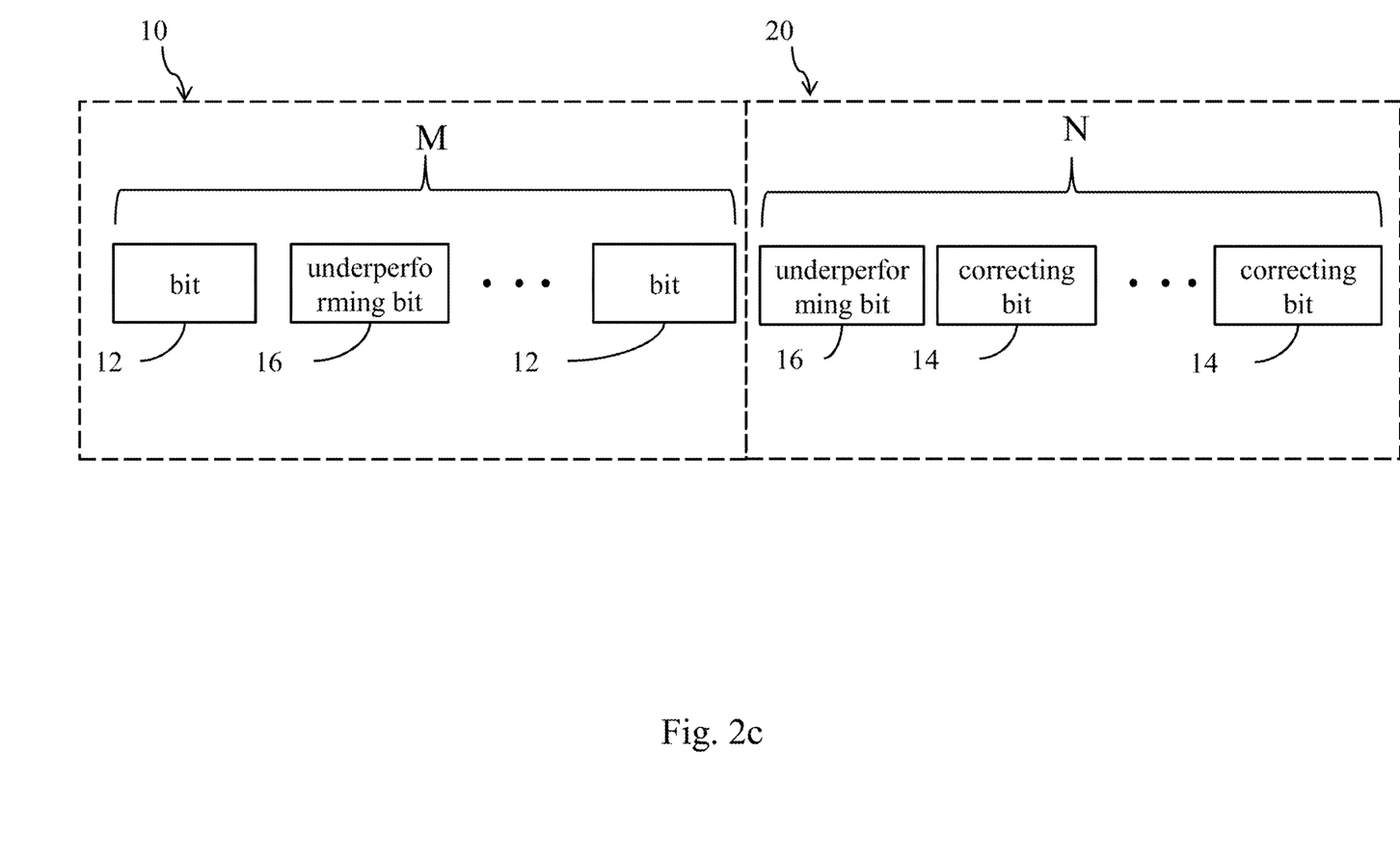
Figure 2D:
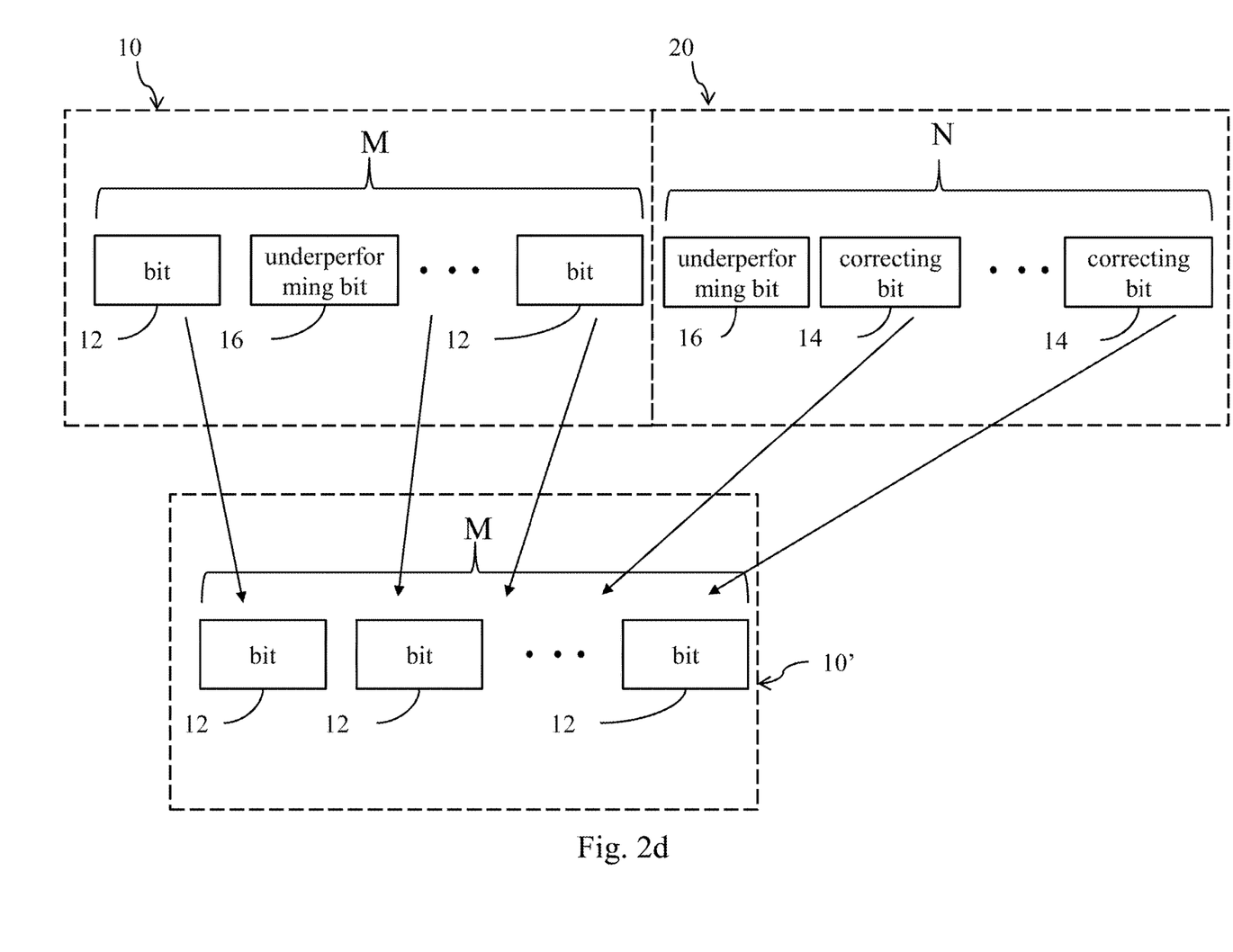
Figure 3:
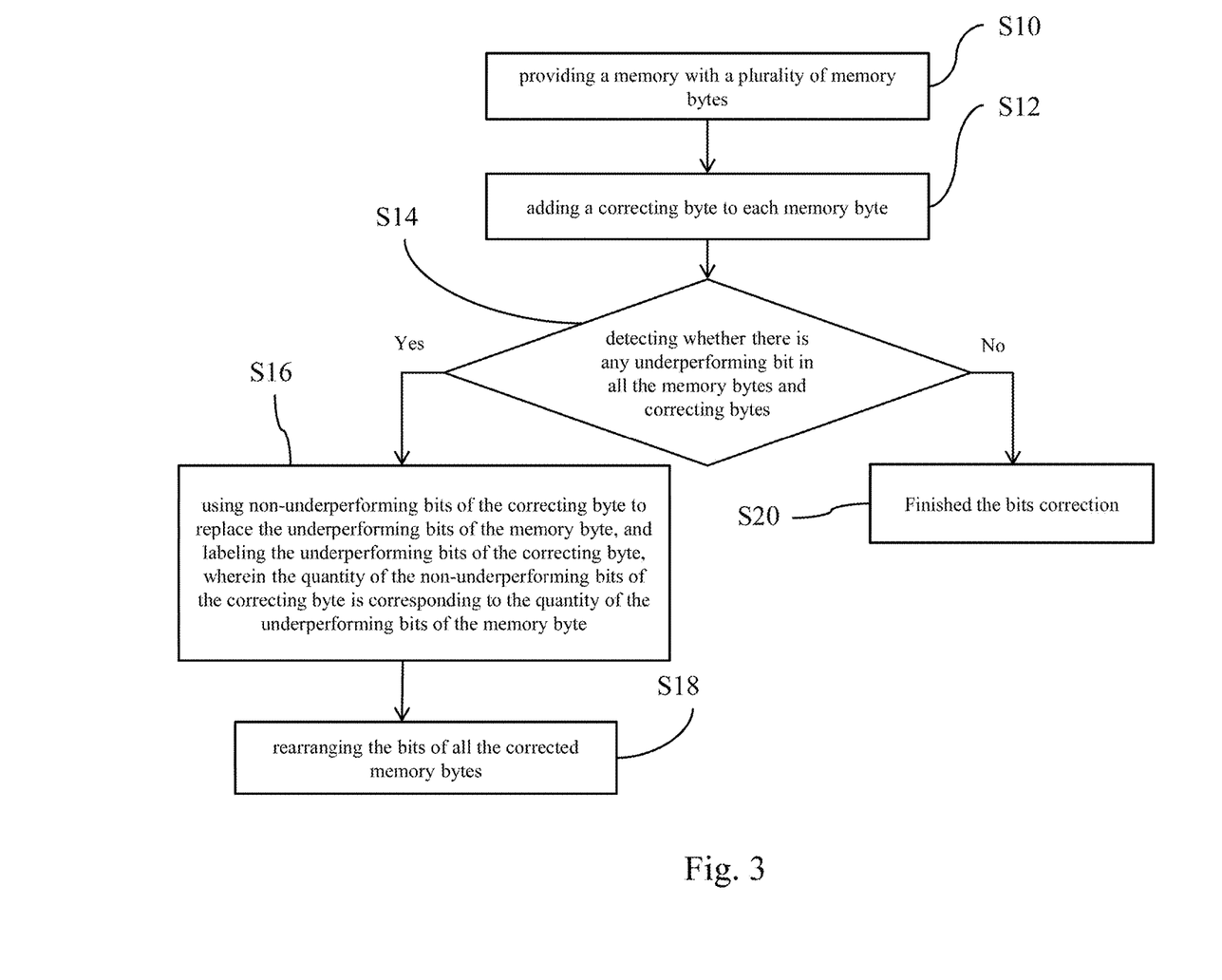
FIG. 3 is a flowchart of a bit-scale memory correcting method according to one embodiment of the present invention.
Figure 4:
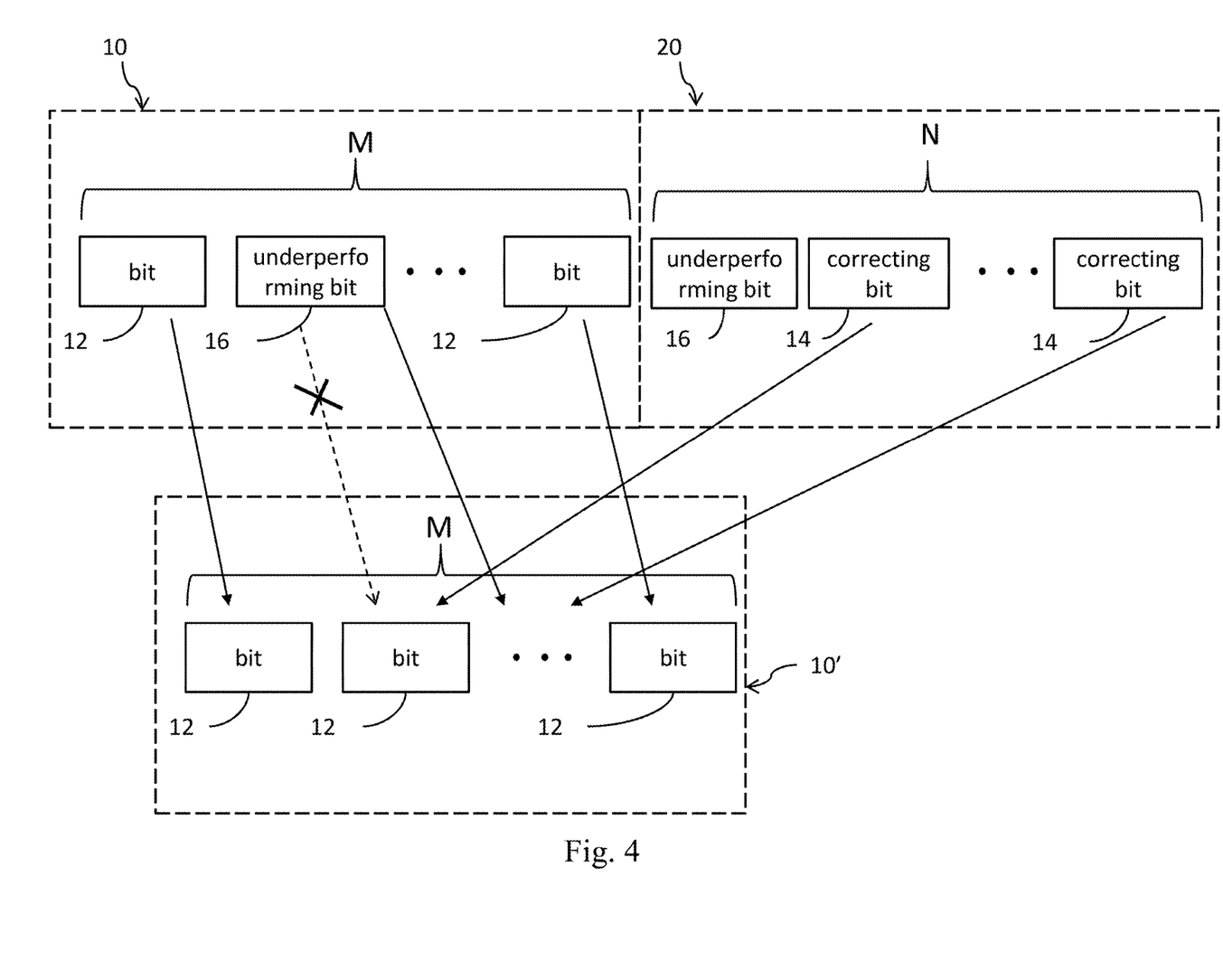
FIG. 4 is a diagram schematically showing a bit-scale memory correcting method according to another embodiment of the present invention.

Refer to FIGS. 2a-2d and FIG. 3, and also refer to FIG. 1 again, for the detailed description of the bit-scale memory correcting method of the present invention. In Step S10, provide a memory byte 10, which contains M bits 12, as shown in FIG. 2a. In Step S12, add a correcting byte 20 to the memory byte 10, wherein the correcting byte 20 contains N correcting bits 14 prepared for correction, as shown in FIG. 2b. In Step S14, detect whether there is any underperforming bit 16 in all the memory bytes 10 and correcting bytes 20, as shown in FIG. 2c. In one embodiment, the underperforming bits 16 of the memory bytes 10 and correcting bytes 20 are detected via the internal reading, writing or disturbing, or the external disturbing of temperature, magnetic fields or electric fields. For example, detect the states of 0 and 1 of the memory bytes 10 and the correcting bytes 20. If at least one underperforming bit 16 is detected in the memory byte 10 and the correcting byte 20, the process proceeds to Step S16. Suppose that there are Q underperforming bits 16 among the M bits 12 of the memory byte 10. In Step S16, use non-underperforming correcting bits 14 of the correcting byte 20 to take the place of the Q pieces of underperforming bits 16, wherein the quantity of the non-underperforming correcting bits 14 is corresponding to Q. Before the Q pieces of underperforming bits 16 are replaced, the Q pieces of underperforming bits 16 are burnt out or put to a non-0 and non-1 third state, and all the underperforming correcting bits 14 of the correcting byte 20 are labeled via burning them out or putting them to a non-0 and non-1 third state. Thus is completed the correction of the memory byte 10. The abovementioned detection and correction steps are repeated to complete the correction of the underperforming bits of all the memory bytes and the labeling of the underperforming bits of all the correcting bytes. After the memory bytes 10 are all corrected, the process proceeds to Step S18. In Step S18, rearrange the memory byte 10 into a memory byte 10', as shown in FIG. 2d. If no underperforming bit is found after detection, the process proceeds to Step S20, and the correction of the memory bytes 10 is terminated. In the embodiment shown in FIG. 2d, the correcting bits 14 are added to the memory byte 10, and then the memory byte 10 is rearranged to dispose the added correcting bits 14 behind the original bits 12. Refer to FIG. 4 for anther embodiment of the present invention. In FIG. 4, the correcting bits 14 are directly disposed in the original positions of the underperforming bits 16 to form a memory byte 10', wherein the corrected memory byte is exempted from rearrangement. The present invention does not limit the quantity of the underperforming bits. However, the quantity of underperforming bits should not exceed N. In other words, the underperforming bits should be less than the correcting bits. Then, the present invention can execute simple and effective correction in all types of memory devices. The quantity N disclosed in the present invention is smaller than the quantity of the correcting bits used in the conventional technology. The value of N is dependent on the error rate of a memory device. Suppose that M=128 and the error rate is about 10%. Thus, N=13-16, which does not exceed the quantity of the bits in the memory byte. If the memory byte has too many underperforming bits, e.g. exceeding the quantity of the correcting bits, there should be some fabrication factors causing the problem. Neither the method of the present invention nor other ordinary memory correction methods can repair such a memory byte. The present invention can effectively correct few underperforming bits in each memory byte, which are generated in an ordinary fabrication condition. In the present invention, the unused correcting bits can be preserved in the memory byte and used when there are bits damaged later. The bit-line and word-line correcting methods can also be used to correct the bit-line-scale errors, the word-line-scale errors, the bit-scale errors unlikely to be burnt out or put to a non-0 and non-1 third state. Therefore, the cooperation of the method of the present invention and the bit-line and word-line correcting methods can achieve a superior correction efficiency.

The embodiments described above are to demonstrate the technical thoughts and characteristics of the present invention to enable the persons skilled in the art to understand, make, and use the present invention. However, these embodiments are not intended to limit the scope of the present invention. Any equivalent modification or variation according to the spirit of the present invention is to be also included within the scope of the present invention.

What is claimed is:

1. A bit-scale memory correcting method comprising steps:
    providing a memory having at least one memory byte having M bits, wherein M is a positive integer;
    adding a paired correcting byte to said at least one memory byte, wherein said paired correcting byte has N correcting bits, and wherein N is a positive integer and less than M;
    applying a stress test to said at least one memory byte and said paired correcting byte; and,
    detecting whether there are any defective bits in said at least one memory byte or said paired correcting byte of said memory and labeling said defective bits in said memory;
    whereby:
    (a) if all bits in said at least one memory byte are operable, then terminate the correcting method; or,
    (b) if at least one bit in said at least one memory byte is defective and all correcting bits in said paired correcting byte are operable, then replace at least one correcting bit into said at least one defective bit in said at least one memory byte and repeat step (b) until all defective bits in said at least one memory byte have been replaced and then terminate the correcting method; or, (c) if at least one bit in said at least one memory byte is defective and at least one correcting bit in said paired correcting byte is defective, then replace an operable correcting bit into said at least one defective bit in said at least one memory byte and repeat step (c) until all said defective bits in said at least one memory byte have been replaced and then terminate the correcting method; or, (d) if all bits in said at least one memory byte are defective or all bits in said correcting byte are defective then terminate the memory correcting method.

2. The bit-scale memory correcting method according to claim 1, wherein said defective bits of said at least one memory byte is burnt out or put to a non-0 and non-1 third state before said operable bits of said paired correcting byte are used to replace said defective bits of said at least one memory byte, and wherein said defective bits of said paired correcting byte is labeled via burning them out or putting them to a non-0 and non-1 third state.

3. The bit-scale memory correcting method according to claim 1, wherein a quantity of said defective bits of said at least one memory byte does not exceed N.

4. The bit-scale memory correcting method according to claim 1, wherein said defective bits of said at least one memory byte and said paired correcting byte are detected via internal reading, writing or disturbing, or external disturbing of temperature, magnetic fields or electric fields.

5. The bit-scale memory correcting method according to claim 1, wherein after all said defective bits of said at least one memory byte have been corrected, said bits of each of said at least one memory byte having been corrected are rearranged.

6. The bit-scale memory correcting method according to claim 1, wherein said at least one memory byte that has been corrected and said paired correcting byte are used as data bits or used as parity bits of an Error-Correction Code (ECC) to enhance reliability in application.

7. The bit-scale memory correcting method according to claim 1, where the at least one memory byte and the paired correcting byte of the memory use a bit-line correcting method and a word-line correcting method to correct bit-line-scale errors, word-line-scale errors, and bit-scale errors that cannot be burnt out or put to a non-0 and non-1 third state.

* * * * *